United States Patent [19]

Richards et al.

[11] Patent Number: 4,794,566
[45] Date of Patent: Dec. 27, 1988

[54] RANDOM ACCESS MEMORY APPARATUS

[75] Inventors: John W. Richards, Chilbolton, Near Stockbridge; Derek P. Allsop, Woking, both of United Kingdom

[73] Assignee: Sony Corporation, Tokyo, Japan

[21] Appl. No.: 13,233

[22] Filed: Feb. 10, 1987

[30] Foreign Application Priority Data

Feb. 25, 1986 [GB] United Kingdom ............... 8604594

[51] Int. Cl.⁴ .............................................. G11C 7/00
[52] U.S. Cl. ...................................... 365/189; 365/233
[58] Field of Search ........................... 365/189, 230, 233

[56] References Cited

U.S. PATENT DOCUMENTS 4,476,548 10/1984 Matsumoto et al. ................ 365/233

Primary Examiner—Joseph A. Popek
Attorney, Agent, or Firm—Lewis H. Eslinger; Donald S. Dowden

[57] ABSTRACT

A random access memory apparatus suitable for sequential write/non-sequential read, for example in a digital video special effects unit, comprises a write enable demultiplexer and a write address generator for demultiplexing incoming data into N channels A to D, where N is at least two, N memories in each of the N channels A to D, the incoming data allocated to any given one of the channels A to D being written into all of the memories in the given channel A to D, a read address generator for reading stored data from any one of the memories and, on reading from a memory, setting a busy flag for that memory, the busy flag being cleared N data periods later, and a busy flag control to control the read address generator to step onto a different memory in the same channel A to D as a memory to be read, when the memory to be read has a set busy flag. Apparatus is also provided for non-sequential write/sequential read and non-sequential write/non-sequential read.

5 Claims, 7 Drawing Sheets

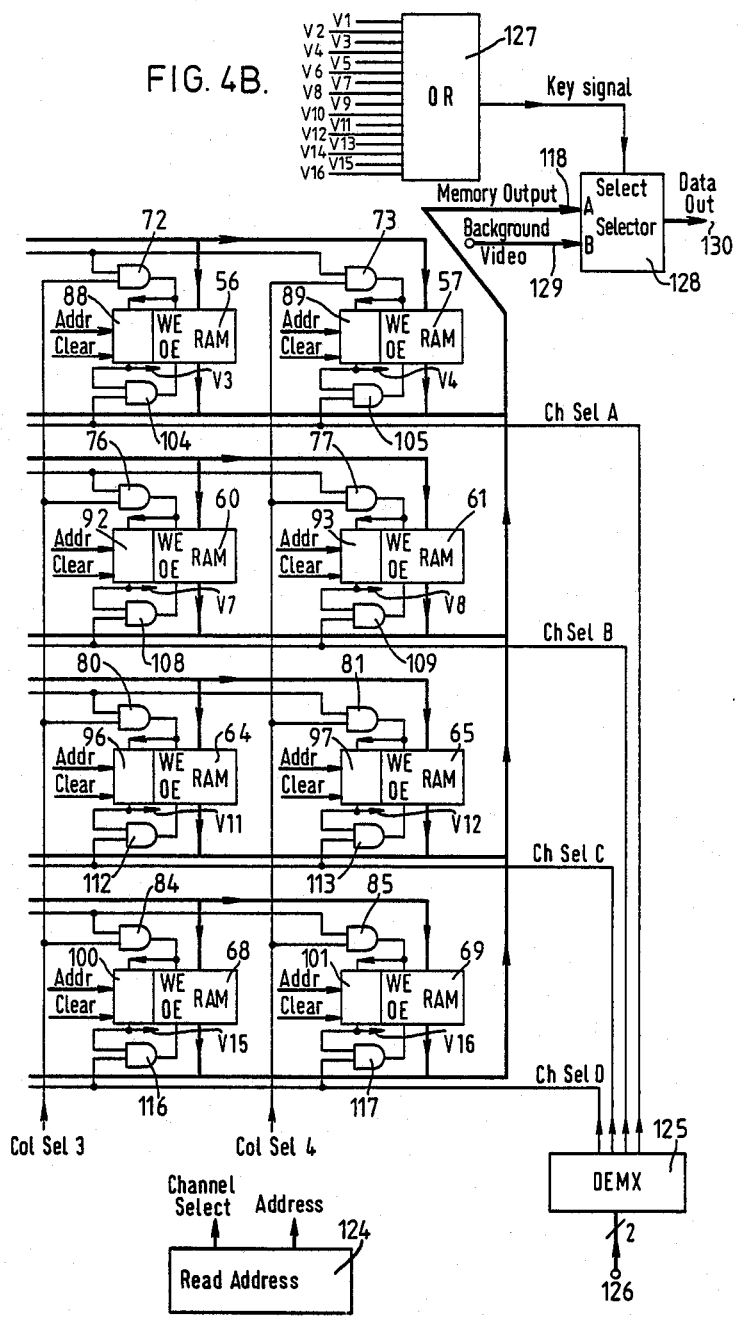

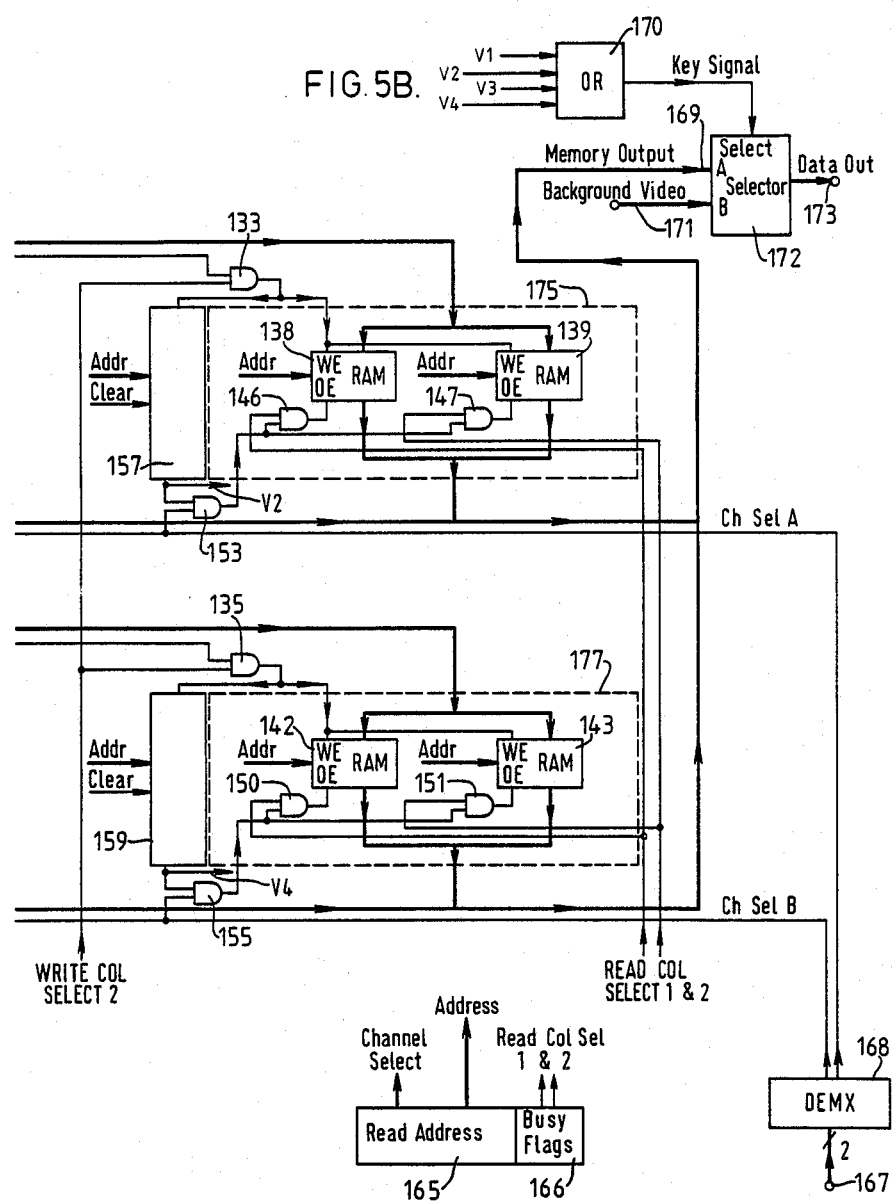

RANDOM ACCESS MEMORY APPARATUS

BACKGROUND OF THE INVENTION

1. Field of the Invention

This invention relates to random access memory apparatus.

2. Description of the Prior Art

Requirements are arising for random access memory apparatus capable of operating at very high writing and reading speeds. For example, a high definition video system has been proposed using 1125 lines per frame and 2048 samples per line, that is, 1125×2048 pixels per frame, and 60 fields per second. The system sample rate is therefore nearly 70 MHz, which means that a period of only about 14 nanoseconds is available for processing or storage of the data of each pixel.

Currently it is difficult to provide field or frame stores capable of operating at such high speed, due to problems of power dissipation, and also the small amount of storage per chip and the high cost of memory devices capable of operating at such high speeds. In a video processor, two video field stores are usually employed to form a frame store, such that as one field is being written into the first field store, the previous field is being read from the second field store. During the next field the video data is read from the first field store and the new video field is written into the second field store, the new field overwriting the 'used' data contained in the second field store. This process is repeated for each field of video so as to produce a continuous data stream at the output.

A well-known technique which is usable to permit operation at higher speeds is demultiplexing, and a simple example of this is shown in FIG. 1 of the accompanying drawings. In this example, the incoming data is demultiplexed four ways, that is, into four channels, so a memory apparatus 1 comprises four identical random access memories (RAMs) 2, 3, 4 and 5. The pixel data are written sequentially, so successive incoming pixel data are supplied by way of a demultiplexing circuit 6 to the RAM 2, to the RAM 3, to the RAM 4, to the RAM 5, to the RAM 2, and so on cyclically. This means tht each of the RAMs 2 to 5 is only accessed once every four sample periods. Likewise, on reading, the pixel data are read sequentially, so successive pixel data are read from the RAM 2, the RAM 3, the RAM4, the RAM 5, the RAM 2, and so on cyclically, and are combined by a multiplexing circuit 7 for supply to a data output.

While this technique increases by a factor of four the intervals between successive times when a given one of the RAMs 2 to 5 is accessed, or more generally increases it by a factor of N where the data are demultiplexed N ways, there can be a problem resulting from the fact that this technique effectively associates specific portions of a television image with particular channels.

This will now be explained with reference to FIG. 2 of the accompanying drawings. This figure shows diagrammatically two successive horizontal lines L and L+1 of a field, and sequences of vertically-aligned pixels along each of the horizontal lines these pixels being numbered P1 to P10 in each horizontal line. On demultiplexing into four channels A, B, C and D for storage, it being assumed that the number of pixels in each horizontal line is divisible by four, the pixel data will be stored in the random access memories in the respective channels A, B, C and D as indicated. So long as both the writing and reading are sequential along the horizontal lines there is no problem; but consider a case where nonsequential reading is required. For example, in a digital video special effects unit it may be required to rotate the image by 90°. To do this it is necessary sequentially to read out, for example, the data of pixels P1,P1, . . . from successive horizontal lines. But all the pixel P1 data are stored in the random access memory in channel A, so this random access memory has to be accesses at the system sample rate, which is unacceptable. Even where the number of pixels in a horizontal line is not exactly divisible by the number of channels, a predetermined storage pattern of some form will nevertheless exist, and will result in problems in at least some cases of non-sequential reading.

More generally, problems will result with the above known demultiplexing technique in the following three cases:
1. sequential write/non-sequential read
2. non-sequential write/sequential read
3. non-sequential write/non-sequential read.

SUMMARY OF THE INVENTION

One object of the present invention is to provide a random access memory arrangement operable with sequential writing and non-sequential reading.

Another object of the present invention is to provide a random access memory arrangement operable with non-sequential writing and sequential reading.

Another object of the present invention is to provide a random access memory arrangement operable with non-sequential writing and non-sequential reading.

According to the present invention there is provided a random access memory apparatus comprising:
  N memories in each of N channels;
  a write enable demultiplexer for selectively supplying write enable signals to said memories;
  a write address generator for writing incoming data into all of said memories in any given one of said channels under control of said write enable signals;
  a read enable demultiplexer for selecting one of said channels;
  a read address generator for reading stored data from any one of said memories in the selected channel and, on reading from a said memory, setting a busy flag for that said memory;
  means to clear said busy flag N data periods later; and
  means to control said read address generator to step reading onto a different said memory in the same said selected channel, when the said memory to be read has a set busy flag.

According to the present invention there is also provided a random access memory apparatus comprising:
  N memories in each of N channels;
  a write enable demultiplexer for selectively supplying write enable signals to said memories;
  a write address generator for writing incoming data allocated by said demultiplexer to any given one of said channels, into one of said memories in said given channel and, on writing into a said memory, setting a busy flag for that said memory, and when said one of said memories has a set busy flag, stepping on to another said memory in said given channel until a said memory without a set busy flag is found;
  means to clear said busy flag N data periods later;

respective additional memory means associated with each said memory, for storing a valid data flag for each location in said memory in which data has been written;

means to clear said valid data flag when said data is cleared from the associated location;

a read enable demultiplexer for selecting a particular memory in a channel in dependence on said valid data flags; and a read address generator for reading stored data from any of said memories and, on reading from a given location in a given said channel, deriving the data from said location in that one of said memories in said channel which has a valid data flag associated with said location.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
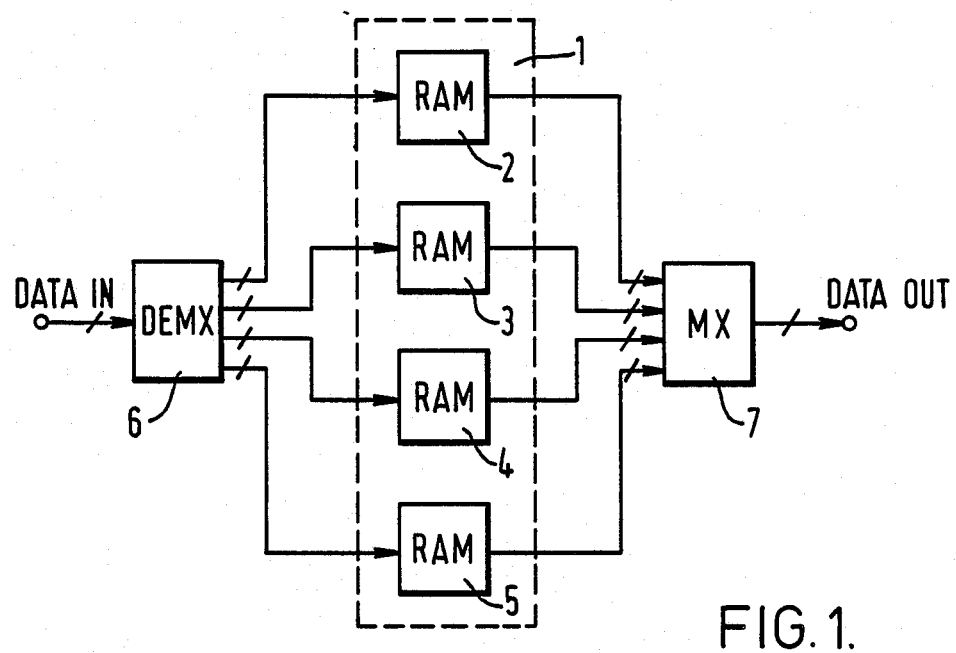
FIG. 1 shows a known random access memory apparatus.
Figure 2:
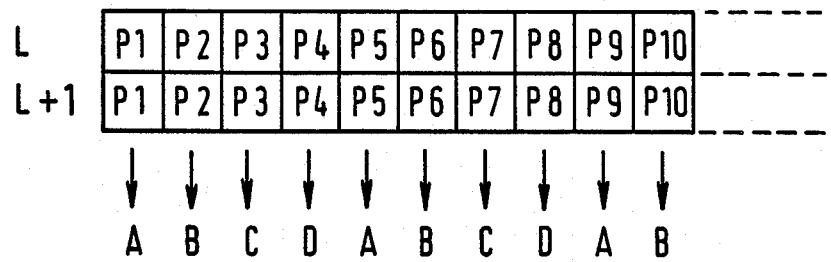
FIG. 2 shows diagrammatically the pixels in part of a television field, and the distribution of the pixel data to channels of a random access memory apparatus.
Figure 3A:
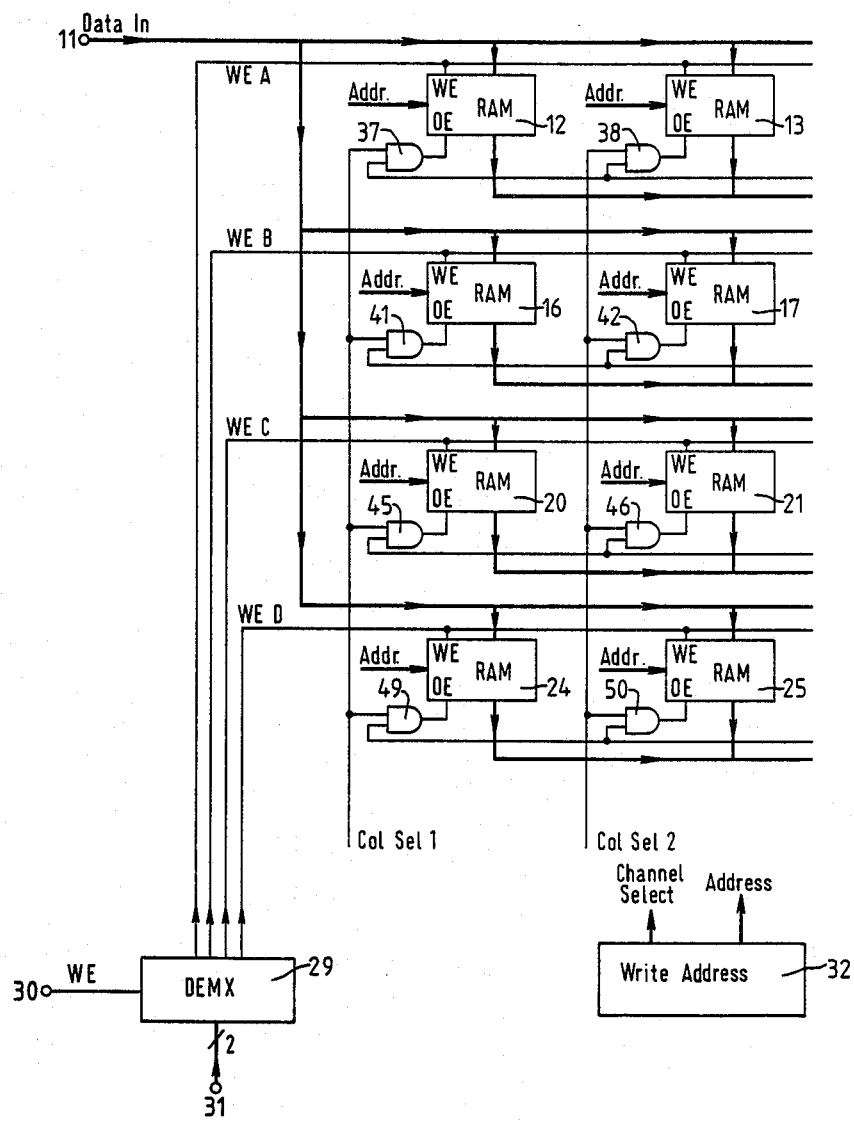
FIGS. 3 to 5 (made up of FIGS. 3A and 3B, 4A and 4B, 5A and 5B respectively) show first to third embodiments respectively of random access memory apparatus according to the present invention.
Figure 3B:
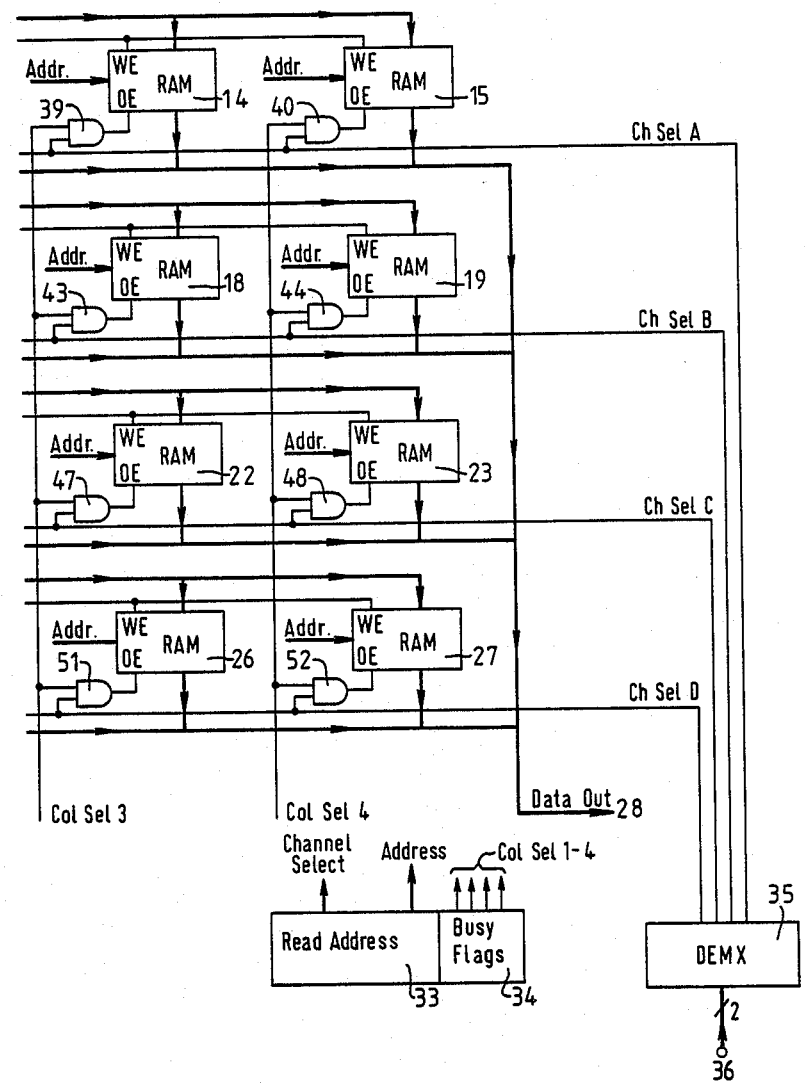

The first embodiment will now be described with reference to FIG. 3. This embodiment provides random access memory apparatus which is suitable for use with sequential write/non-sequential read.

Incoming data, assumed to be pixel data relating to a high definition video system are supplied by way of a data input terminal 11 to an array of sixteen identical RAMs 12 to 27; each being capable of storing one quarter of a video field, four being provided in each of channels A to D, and each being connected to a data output terminal 28. Each of the RAMs 12 to 27 comprises a clocked address latch. The apparatus also comprises a write enable demultiplexer 29 to which write enable signals are supplied by way of an input terminal 30, and which distributes the write enable signals to the RAMs 12 to 27 in the four channels A, B, C and D under control of a channel selector signal supplied to a control terminal 31. A write address generator 32 supplies the channel selector signal to the control terminal 31, and also supplies write addresses to each of the RAMs 12 to 27. A read address generator 33 supplies a channel selector signal to a read enable demultiplexer 35 by way of a control terminal 36. The read address generator 33 has associated with it a flag memory 34 for storing memory busy flags, referred to in more detail below, and associated control logic. The read enable demultiplexer 35 supplies four channel selector signals A to D which are gated with column selector signals 1 to 4 supplied by the flag memory 34 in read enable gates 37 to 52 respectively connected to the read enable inputs of the RAMs 12 to 27.

The read address generator 33 also supplies read addresses to the RAMs 12 to 27. The read addresses are the same for all the RAMs 12 to 27, and to read from a specific one of the RAMs 12 to 27, say the RAM 17, the channel B is selected by the channel selector signal B supplied to the control terminal 31 by the write address generator 32, and the second column is selected by the column selector signal 2.

On writing, demultiplexing is carried out in the usual way, but with the difference that the data of each pixel are written in all four of the RAMs 12 to 27 in the selected one of the channels A to D, the channels A to D being selected cyclically. This means that at any given time all four of the RAMs 12 to 27 in any one of the channels A to D have the same data stored therein.

On reading, each time a specific one of the RAMs 12 to 27 has been accessed, a memory busy flag is set in respect of that one of the RAMs 12 to 27 in the flag memory 34, the flag being cleared four sample periods later. If the same one of the channels A to D is accessed to be read again before the busy flag has been cleared, then the reading passes to the next one of the RAMs 12 to 27 in that channel not having a busy flag set, under control of the appropriate column selector signal 1 to 4 supplied by the flag memory 34. As there are four of the RAMs 12 to 27 in each of the channels A to D, there will always be an available one of the RAMs 12 to 27 in every one of the channels A to D.

Two specific examples of reading may be considered. Firstly, if the read is sequential, as where there is no manipulation of an image, successive output pixel data will be read from the RAMs 12, 16, 20, 24, 12, . . . , that is, from the first random access memory in each of the channels A to D. Secondly, in the worst case, mentioned above, at 90° rotation of the image, then successive output pixel data will be read from the RAMs 12, 13, 14, 15, 12, . . . , that is, all from the channel A.

Figure 4A:
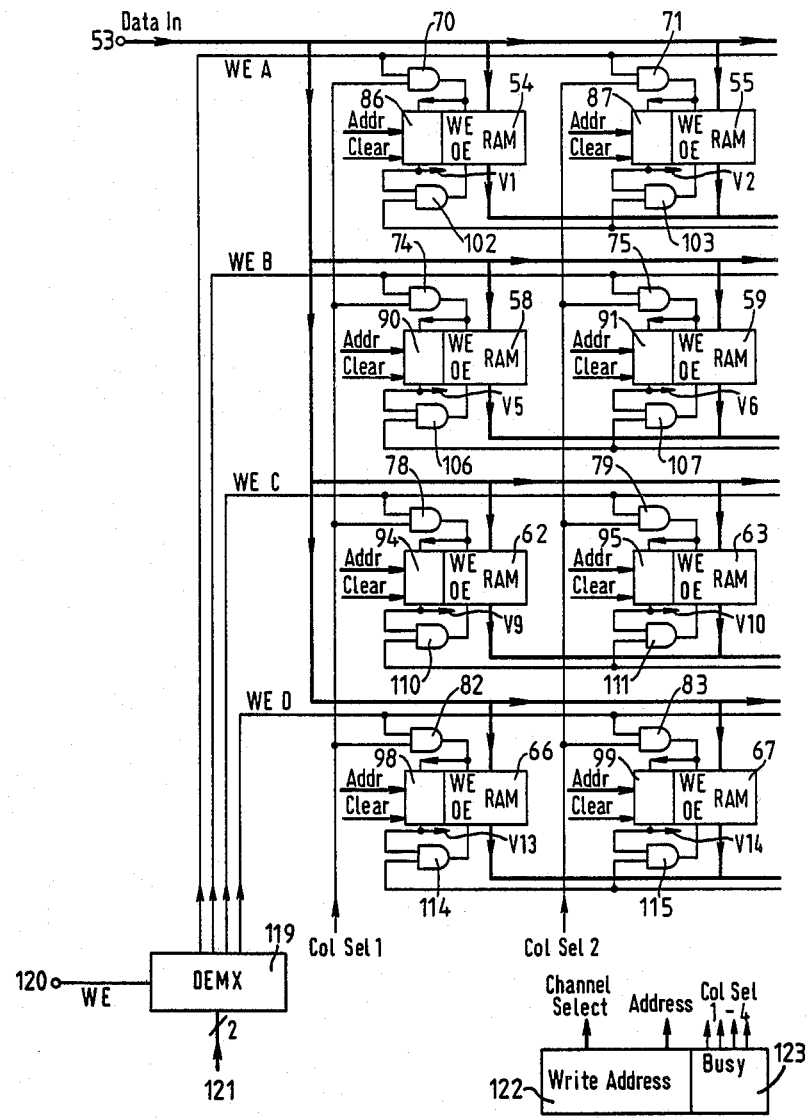

The second embodiment will now be described with reference to FIG. 4. This embodiment provides random access memory apparatus which is suitable for use with non-sequential write/sequential read.

Incoming data, assumed to be pixel data relating to a high definition video system are supplied by way of an input terminal 53 to an array of sixteen identical RAMs 54 to 69; each being capable of storing one quarter of a video field, four being provided in each of channels A to D, each having a respective 1-bit key memory plane 86 to 101 associated with it, and each being connected to a memory data output 118. Each of the RAMs 54 to 69 comprises a clocked address latch.

The apparatus also comprises a write enable demultiplexer 119 to which write enable signals are supplied by way of an input terminal 120, and which distributes the write enable signals to write enable gates 70 to 85 respectively associated with the RAMs 54 to 69 in the four channels A to D, under control of a channel selector signal supplied to a control terminal 121. A write address generator 122 supplies the channel selector signal to the control terminal 121, and write addresses to each of the RAMs 54 to 69 and key memory planes 86 to 101. Associated with the write address generator 122 is a flag memory 123 for storing a respective busy flag corresponding to each RAM 54 to 69, and referred to in more detail below, and associated control logic.

The outputs of the RAMs 54 to 69, assumed to be tristate outputs, are supplied to the memory data output 118 under the control of respective read enable gates 102 to 117. A read address generator 124 comprising a counter and control logic, supplies the read addresses to each of the RAMs 54 to 69 and to the key memory planes 86 to 101, and also supplies a channel selector signal to a read control demultiplexer 125 by way of a control terminal 126. The read control demultiplexer 125 is used to control the enabling of specific outputs from the RAMs 54 to 69 to the memory data output 118 by means of the read gates 102 to 117, in conjunction with the outputs of the key memory planes 86 to 101.

A selector 128 is used to switch the connection to a data output terminal 130 between the memory data output 118 and an alternative (for example, background) video data input 129 under control of a 16-input OR gate 127. This will be described in more detail below.

Prior to writing a particular video field, all the key memory planes 86 to 101 are cleared. On (non-sequential) writing, the write address generator 122 produces a write address and a channel selector signal which correspond to the location of the desired pixel. Once an address and channel have been selected, the first available free one of the RAMs 54 to 69 in the appropriate channel A to D is selected in dependence on the busy flags, that is, under the control of column selector signals 1 to 4 supplied by the flag memory 123.

As the data is written into the selected RAM 54 to 69, the busy flag associated with that RAM 54 to 69 is also set in the flag memory 123, and in addition the key memory plane bit associated with that data location is set to indicate the presence of valid data in that location in that RAM 54 to 69. Each busy flag is cleared four sample periods after it has been set, so the availability of at least one free RAM 54 to 69 with a clear busy flag in each of the columns 1 to 4 is always guaranteed. If, for example, pixel data is to be written into the channel A and a busy flag is set in respect of the RAM 54, then the flag memory 123 will cause stepping on to the next RAM 55 in the channel A, and so on until one of the RAMs 54 to 57 not having a busy flag is found.

In this apparatus it is of course necessary to know into which of the RAMs 54 to 69 the data has been written. Each of the RAMs 54 to 69 therefore has the additional key bit stored in the respective one of the key memory planes 86 to 101, which is used for writing valid data flags which are set for all the memory locations which have been written into. The valid data flags are cleared before any data relating to a new field is written into any of the RAMs 54 to 69.

On reading, the read address generator 124 produces sequential read addresses at the output by means of a counter, the two least significant bits of each of which are used as the channel selector signal, and the remainder being the read address which is supplied to each RAM 54 to 69 and key memory plane 86 to 101 in the selected channel A to D.

For any given address, only one of the memory planes 86 to 101 in each of the channels A to D can have the valid data bit associated with that memory location (as directed earlier during the write cycle by the write enable demultiplexer 119). This output signal from that one of the key memory planes 86 to 101 is used in conjunction with the channel select signals A to D to enable a maximum of one RAM 54 to 69 to supply an output to the memory data output 118.

Outputs from all the read enable gates 102 to 117 are OR-gated to produce a key signal at the output of the OR gate 127. This key signal determines the presence (or absence) of video data written into that particular pixel location, as it can readily be imagined that many video effects do not cover the whole of the screen, for example, where there is a reduction in picture size. The key selector signal is used to select either the memory data output 118 or alternatively the (background) video data input 129 via the selector 128, and to route it to the data output terminal 130.

Figure 5A:
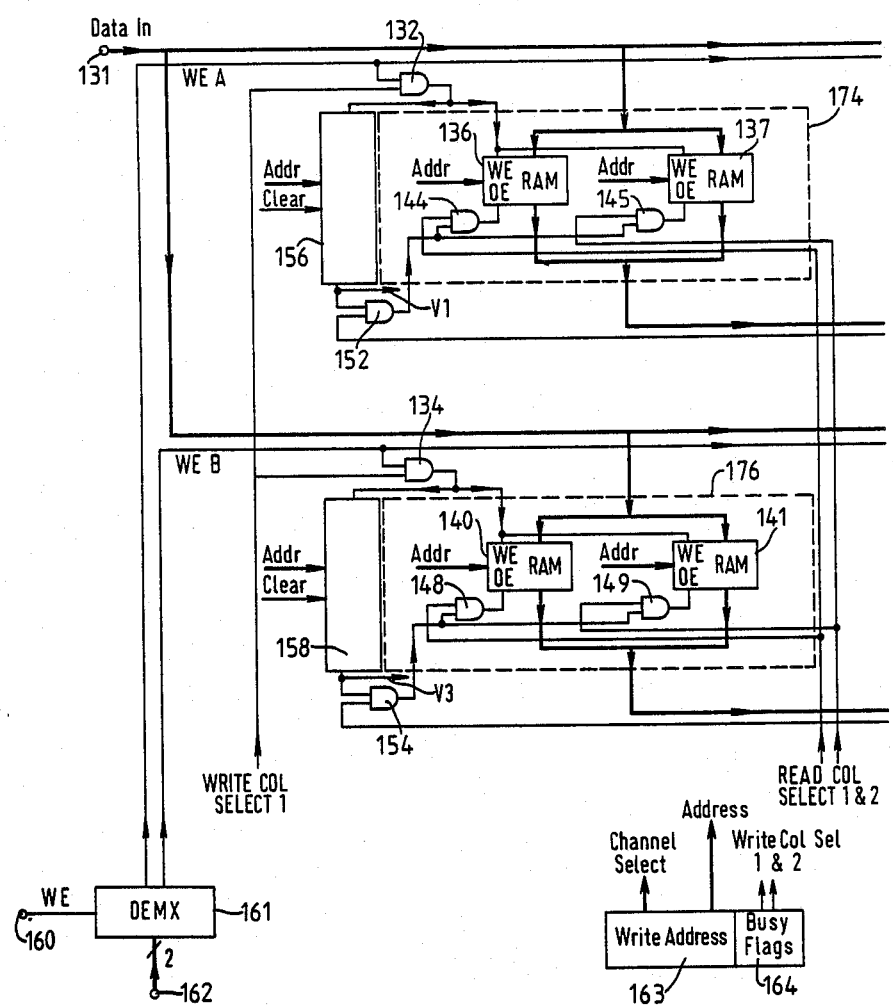

The third embodiment will now be described with reference to FIG. 5. This embodiment provides random access memory apparatus which is suitable for use with non-sequential write/non-sequential read.

Basically, the third embodiment is a combination of the first and second embodiments, and because of the additional complexity which this involves, will be described for a two channel apparatus, rather than the four-channel apparatus described for the first and second embodiments. The third embodiment is generally similar to the second embodiment, but each random access memory in each of the two channels A and B is replaced by a memory block 174 to 177 comprising two RAMs 136 and 137, 138 and 139, 140 and 141, and 142 and 143 respectively, and respective read enable gates 144 to 151, similar to the arrangement in the first embodiment.

Incoming data, again assumed to be pixel data relating to a high definition video system, are supplied by way of an input terminal 131 to each of the four memory blocks 174 to 177, each of which is capable of storing one half of a video field. The outputs of the memory blocks 174 to 177, assumed to be tristate outputs, are combined for supply to a memory data output 169 with the output controlled by the read enable gates 144 to 151, and read enable gates 152 to 155. Associated with each memory block 174 to 177 is a respective 1-bit key memory plane 156 to 159, substantially as described in the second embodiment, the outputs of which are used selectively to enable the read enable gates 144 to 155 as described in greater detail below.

A write enable demultiplexer 161 controls the distribution of write enable signals received at an input terminal 160 to each of the channels A and B under the control of a channel select signal supplied to a control terminal 162 from a write address generator 163. Associated with the write address generator 163 is also a write flag memory 164 and associated control logic, used to control writing into each of the four memory blocks 174 to 177. The memory blocks 174 to 177 are as described in the second embodiment, and also in greater detail below.

When reading from the apparatus, a read address generator 165 addresses the RAMs 136 to 143 and selects the appropriate channel A or B by supplying a channel selector signal to a control terminal 167 of a read enable demultiplexer 168. Associated with the read address generator 165 is a flag memory 166 and associated control logic for storing eight busy flags, one corresponding to each of the memories 136 to 143.

A 4-input OR-gate 170 is used to detect the presence of valid data from any memory block 174 to 177 and to select either the memory data output 169 or a background video data input 171 via a selector 172 for connection to at a data output terminal 173.

The apparatus will now be described in greater detail and with reference to specific example to clarify the operation. Prior to writing any video data into the RAMs 136 to 143, the key memory planes 156 to 159 are cleared.

On writing, the write address generator 163 produces an address which is common to all the RAMs 136 to 143 and the key memory planes 156 to 159, and a channel select signal to select channel A or B dependent upon the spatial position of the data (odd or even pixel). This was referred to above and illustrated in four-way demultiplexed form in FIG. 4. Data is written into the first non-busy RAM 136 to 143 in selected channel A or B according to the status of the write busy flags stored in the flag memory 164, and which cause appropriate write column selector signals 1 and 2 to be supplied to the write enable gates 132 to 135. When data is supplied to a memory block 174 to 177 then it is written in both of the RAMs 136 and 137, or 138 and 139 or 140 and 141, or 142 and 143 in that memory block 174 to 177. In addition, the write busy flag associated with the selected memory block 174 to 177 is set, to be cleared two sample periods later after writing has been completed.

Thus, if, for example, pixel data were written sequentially, it would be written into the memory blocks 174, 176, 174, 176, . . . If, as in the worst case of 90° picture rotation, it were continually written into, say, channel A, then it would be written into the memory blocks 174, 175, 174, 175, . . .

During reading, the read address generator 165 produces addresses common to all the RAMs 136 to 143 and the key memory planes 156 to 159. The memory blocks 174, 175, 176 or 177 are enabled via the read enable gates 152 to 155 according to a read channel selector signal supplied by the demultiplexer 168, and the valid data indicator from the appropriate key memory plane 156 to 159, substantially as referred to in the second embodiment. The read flag memory 166 associated with the address generator 165 stores eight busy flags associated respectively with each of the RAMs 136 to 143. On reading from a particular memory block 170 to 173, the first non-busy random access memory of the selected pair 136/137, 138/139, 140/141 or 142/143 is accessed in dependence on a read column selector signal 1 or 2 supplied by the flag memory 166 according to the status of the stored read busy flags. In addition, the busy flag in respect of that memory block 174 to 177 is set to be cleared two sample periods later by the control logic associated with the flag memory 166.

It can be seen that for sequential write, sequential read, the RAMs 136 and 140 will be accessed alternately during writing and reading. The worst case for reading corresponds to continuous reading from one of the memory blocks 174 to 177. This would occur for example in a simple reduction in picture size by a factor of two, where reduction of the data causes data to be read from a single memory block, say 174, in which case data would then be alternately read from the RAMs 136 and 137. Other more complex effects would involve all the RAMs 136 to 143.

Various modifications are of course possible without departing from the invention as defined by the appended claims. In particular, the number of channels can be varied. However, in this connection, it will be seen that with the first embodiment, assuming that a basic arrangement would in any case be demultiplexed into N channels, the total number of random access memories required, each of 1/N the size of a field, is $N^2$. Thus, the total amount of storage required is multiplied by a factor of N. In other words, this embodiment involves a trade-off between speed and the number of memories. Likewise, the second embodiment involves an increase in the storage required by a factor of N. In the case of the third embodiment, however, the increase in the total amount of storage is by a factor $N^2$, and hence the third embodiment will generally not be used where N is greater than two.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A random access memory apparatus for processing data in successive sample periods, said apparatus comprising:

N memories in each of N channels, wherein N is at least two;

a busy flag memory;

a write enable demultiplexer for selectively supplying write enable signals to said memories;

a write address generator for writing incoming data into all of said memories in any given one of said channels under control of said write enable signals;

a read enable demultiplexer for selecting one of said channels;

a read address generator for reading stored data from any one of said memories in the selected channel and, on reading from said one memory, setting a busy flag corresponding thereto in said busy flag memory to mark said one memory as busy;

means to clear said busy flag N sample periods later; and means responsive to said busy flag to control said read address generator to read from a memory in said one selected channel other than said one memory.

2. A random access memory apparatus according to claim 1 wherein N is equal to four.

3. A random access memory apparatus for processing data in successive sample periods, said apparatus comprising:

N memories in each of N channels, where N is at least two and each memory has a plurality of memory locations;

a busy flag memory;

a write enable demultiplexer for selectively supplying write enable signals to said memories;

a write address generator for writing incoming data designated by said demultiplexer for any given one of said channels, into one of said memories in said given channel and, on writing into said one memory, setting a busy flag corresponding thereto in said busy flag memory to mark said one memory as busy, and, when said one memory has a set busy flag corresponding thereto, stepping on to another of said memories in said given channel until reaching a memory corresponding to which no set busy flag is found;

means to clear said busy flag N sample periods later;

respective additional memory means associated with each of said memories for storing valid data flags respectively associated with each memory location in which data has been written;

means to clear each of said valid data flags when said data is cleared from the associated memory location;

a read enable demultiplexer for selecting a particular memory in a channel in dependence on said valid data flags; and a read address generator for reading stored data from any of said memories and, on reading from a given memory location in a particular one of said channels, deriving the data from one of said memories in said particular channel which has a valid data flag associated with said given memory location.

4. A random access memory apparatus according to claim 3 further comprising:

an OR gate for combining said valid data flags into a key signal to indicate the presence or absence of valid video data in any of said memory locations;

a selector controlled by said OR gate to switch between data read from one of said memory locations and an alternative data source.

5. A random access memory apparatus according to claim 3 wherein N is equal to four.

* * * * *